United States Patent
Hane et al.

(10) Patent No.: US 12,077,855 B2
(45) Date of Patent: Sep. 3, 2024

(54) CLEANING METHOD AND FILM DEPOSITION APPARATUS

(71) Applicant: Tokyo Electron Limited, Tokyo (JP)

(72) Inventors: Hideomi Hane, Yamanashi (JP); Akihiro Kuribayashi, Yamanashi (JP); Noriaki Fukiage, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/053,880

(22) Filed: Nov. 9, 2022

(65) Prior Publication Data

US 2023/0175125 A1    Jun. 8, 2023

(30) Foreign Application Priority Data

Dec. 6, 2021 (JP) .................. 2021-198043

(51) Int. Cl.
| | |
|---|---|
| *C23C 16/44* | (2006.01) |
| *B08B 7/00* | (2006.01) |
| *B08B 13/00* | (2006.01) |
| *C23C 16/455* | (2006.01) |
| *C23C 16/458* | (2006.01) |
| *H01L 21/02* | (2006.01) |
| *H01L 21/687* | (2006.01) |

(52) U.S. Cl.
CPC ........ *C23C 16/4405* (2013.01); *B08B 7/0035* (2013.01); *B08B 13/00* (2013.01); *C23C 16/45544* (2013.01); *C23C 16/4584* (2013.01); *H01L 21/0217* (2013.01); *H01L 21/0228* (2013.01); *H01L 21/68764* (2013.01)

(58) Field of Classification Search
None
See application file for complete search history.

(56) References Cited

U.S. PATENT DOCUMENTS

2013/0047924 A1* 2/2013 Enomoto .......... C23C 16/45551
118/725

FOREIGN PATENT DOCUMENTS

| JP | 2010-153805 | | 7/2010 | |
|---|---|---|---|---|
| KR | 20120021514 | * | 3/2012 | ......... C23C 16/4405 |

OTHER PUBLICATIONS

KR20120021514 English translation, accessed on Dec. 2023. (Year: 2012).*

* cited by examiner

*Primary Examiner* — Eric W Golightly
*Assistant Examiner* — Arlyn I Rivera-Cordero
(74) *Attorney, Agent, or Firm* — IPUSA, PLLC (57) ABSTRACT

With respect to a cleaning method of cleaning an inside of a processing chamber in a film deposition apparatus including a rotary table rotatably provided in the processing chamber, multiple mounting areas being provided on the rotary table in a circumferential direction, the cleaning method includes (a) discharging a carrier gas and a cleaning gas with rotating the rotary table, a flow rate of the carrier gas being adjusted to a first flow rate, (b) discharging the carrier gas and the cleaning gas with rotating the rotary table, the flow rate of the carrier gas being adjusted to a second flow rate less than the first flow rate, and (c) performing switching from (a) to (b) and switching from (b) to (a) a predetermined number of times while the rotary table rotates by one revolution, the predetermined number being equal to a number of the multiple mounting areas.

7 Claims, 8 Drawing Sheets

CLEANING METHOD AND FILM DEPOSITION APPARATUS

CROSS-REFERENCE TO RELATED APPLICATIONS

This patent application is based on and claims priority to Japanese Patent Application No. 2021-198043 filed on Dec. 6, 2021, the entire contents of which are incorporated herein by reference.

TECHNICAL FIELD

The present disclosure relates to a cleaning method and a film deposition apparatus.

BACKGROUND

An apparatus for depositing a film on multiple substrates by placing the multiple substrates along a rotational direction of a rotary table and supplying a processing gas from nozzles provided along a radial direction of the rotary table with the rotary table being rotated is known (for example, Patent Document 1). In the apparatus of Patent Document 1, the film is also deposited on the rotary table. When the amount of the deposited film increases, particles are produced. Therefore, in the above-described apparatus, cleaning is performed periodically by supplying a cleaning gas to the rotary table to remove the film deposited on the rotary table.

RELATED ART DOCUMENT

Patent Document

[Patent Document 1] Japanese Laid-open Patent Application Publication No. 2010-153805

SUMMARY

According to one aspect of the present disclosure, with respect to a cleaning method of cleaning an inside of a processing chamber in a film deposition apparatus, the film deposition apparatus including a rotary table rotatably provided in the processing chamber and a gas injector provided to pass through a side wall of the processing chamber, a plurality of mounting areas being provided on the rotary table in a circumferential direction, and a wafer being mounted on each of the plurality of mounting areas, the cleaning method includes (a) discharging a carrier gas and a cleaning gas from the gas injector into the processing chamber with rotating the rotary table, a flow rate of the carrier gas being adjusted to a first flow rate, (b) discharging the carrier gas and the cleaning gas from the gas injector into the processing chamber with rotating the rotary table, the flow rate of the carrier gas being adjusted to a second flow rate that is less than the first flow rate, and (c) performing switching from (a) to (b) and switching from (b) to (a) a predetermined number of times while the rotary table rotates by one revolution, the predetermined number being equal to a number of the plurality of mounting areas.

DETAILED DESCRIPTION OF EMBODIMENTS

In the following, a non-limiting illustrative embodiment of the disclosure will be described with reference to the accompanying drawings. In all the accompanying drawings, the same or corresponding members or parts are referenced by the same or corresponding reference signs, and duplicate descriptions are omitted.

[Film Deposition Apparatus]

An example of a film deposition apparatus according to an embodiment will be described with reference to FIGS. 1 to 4. A film deposition apparatus 1 is an apparatus that forms a silicon nitride (SiN) film on the surface of a substrate by atomic layer deposition (ALD) or molecular layer deposition (MLD). The substrate is, for example, a semiconductor wafer (hereafter referred to as the "wafer W").

Figure 1:
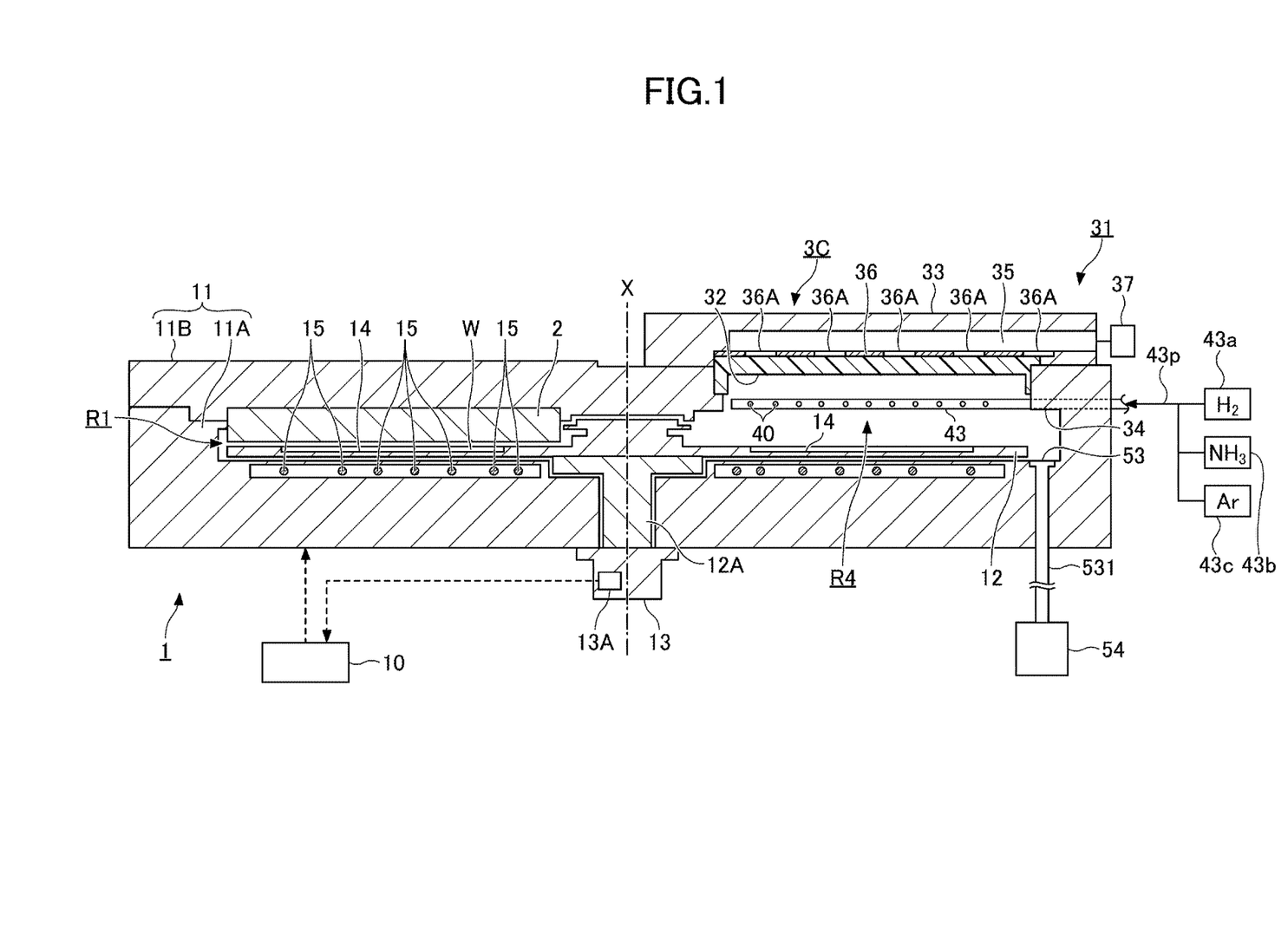
FIG. 1 is a schematic longitudinal cross-sectional view illustrating an example of a film deposition apparatus according to an embodiment.

The film deposition apparatus 1 includes a vacuum chamber 11 as a processing chamber. The vacuum chamber 11 has a substantially circular planar shape. The vacuum chamber 11 includes a body 11A and a top plate 11B. The body 11A has a sidewall and a bottom. The top plate 11B is attached to the body 11A through a sealing member such as an O-ring, for example. This allows the vacuum chamber 11 to be airtightly sealed. The body 11A and the top plate 11B can be made of, for example, aluminum (Al).

A rotary table 12 is provided in the vacuum chamber 11. The rotary table 12 has a disk shape and can be made of, for example, quartz. The rotary table 12 is supported by a support 12A at the center of the back surface and is horizontally provided.

Figure 2:
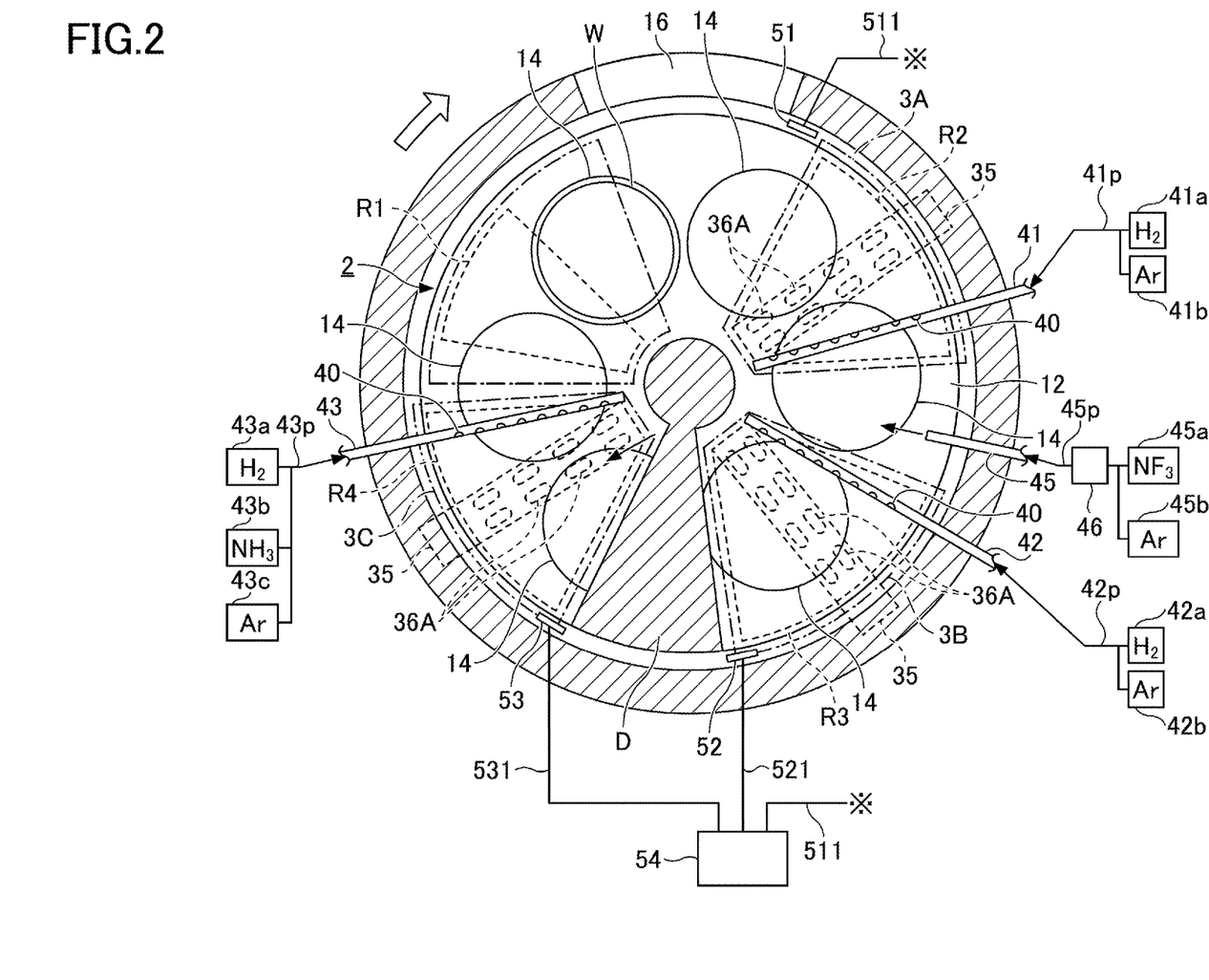
FIG. 2 is a schematic plan view of the film deposition apparatus of FIG. 1.

On the upper surface of the rotary table 12, six recesses 14 are provided along a circumferential direction (a rotational direction) of the rotary table 12. The recess 14 is an example of a mounting area. Each recess 14 has a circular shape in plan view and has a recessed shape with respect to the upper surface of the rotary table 12. The wafer W is mounted on each recess 14.

A rotation mechanism 13 is connected to the lower surface of the support 12A. The rotation mechanism 13 rotates the rotary table 12 through the support 12A in the circumferential direction of the rotary table 12 around an axis X in a clockwise direction in plan view during the film deposition process. The rotation mechanism 13 includes an encoder 13A configured to detect the rotation angle of the rotary table 12 (the support 12A), and transmits, to a controller 10, the rotation angle of the rotary table 12 that is detected by the encoder 13A. The controller 10 identifies the position of each recess 14 on the rotary table 12 based on the rotation angle of the rotary table 12 transmitted from the rotation mechanism 13.

Multiple heaters 15 are provided at the bottom of the body 11A. The multiple heaters 15 are disposed in concentric circles, for example. The multiple heaters 15 heat the wafers W mounted on the rotary table 12.

A transfer port 16 is provided on the side wall of the body 11A. The transfer port 16 is an opening for receiving and transferring the wafer W. The transfer port 16 is configured such that the transfer port 16 can airtightly be opened and closed by a gate valve (not illustrated). A transfer arm (not illustrated) is provided outside the vacuum chamber 11, and the wafer W is transferred into the vacuum chamber 11 by the transfer arm.

On the rotary table 12, a gas supply and exhaust unit 2, a second processing region R2, a third processing region R3, and a fourth processing region R4 are provided in this order toward the downstream side of the rotational direction of the rotary table 12 along the rotational direction.

The gas supply and exhaust unit 2 includes a gas discharge port for supplying a silicon (Si)-containing gas and an exhaust port. The gas supply and exhaust unit 2 will also be described below with reference to FIG. 3. In plan view, the gas supply and exhaust unit 2 is formed in a fan shape that extends along the peripheral edge of the rotary table 12 in the circumferential direction and from the center side to the peripheral edge side of the rotary table 12 in the radial direction. The lower surface of the gas supply and exhaust unit 2 is close to and opposite to the upper surface of the rotary table 12.

Figure 3:
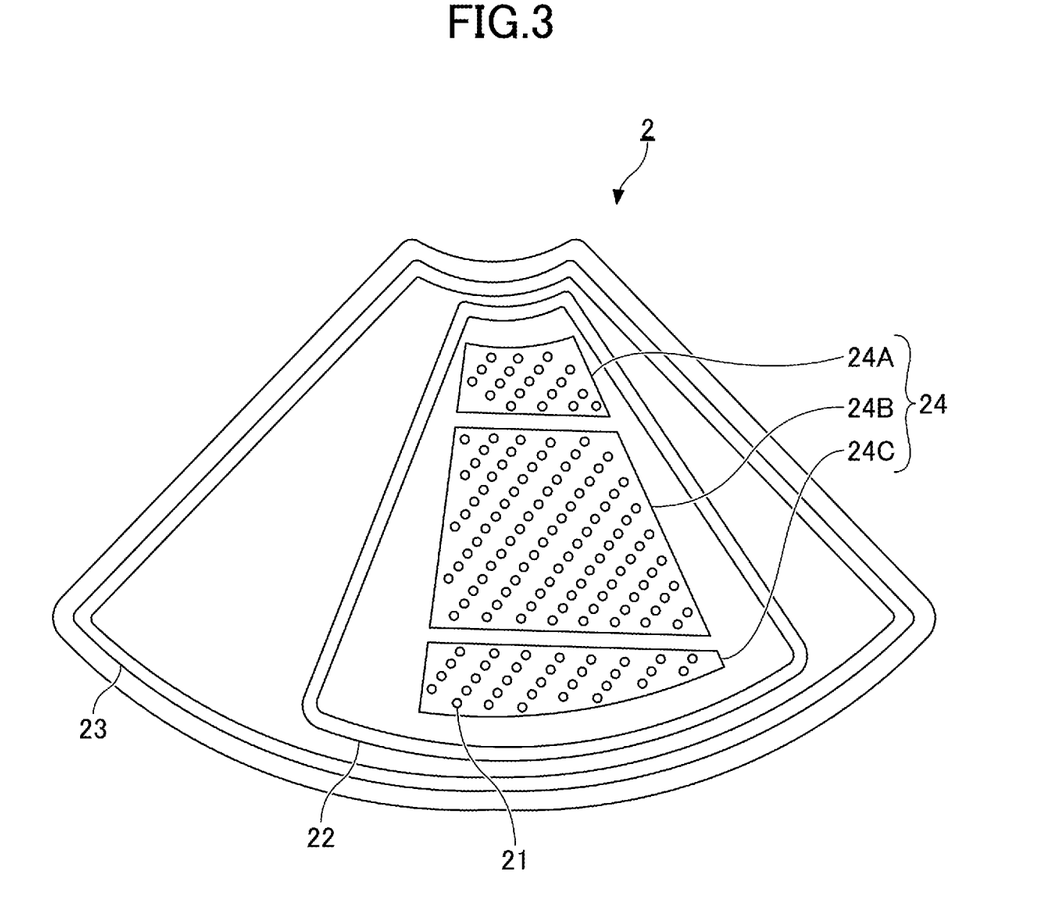
FIG. 3 is a bottom view of a gas supply and exhaust section provided in the film deposition apparatus of FIG. 1.
Figure 4:
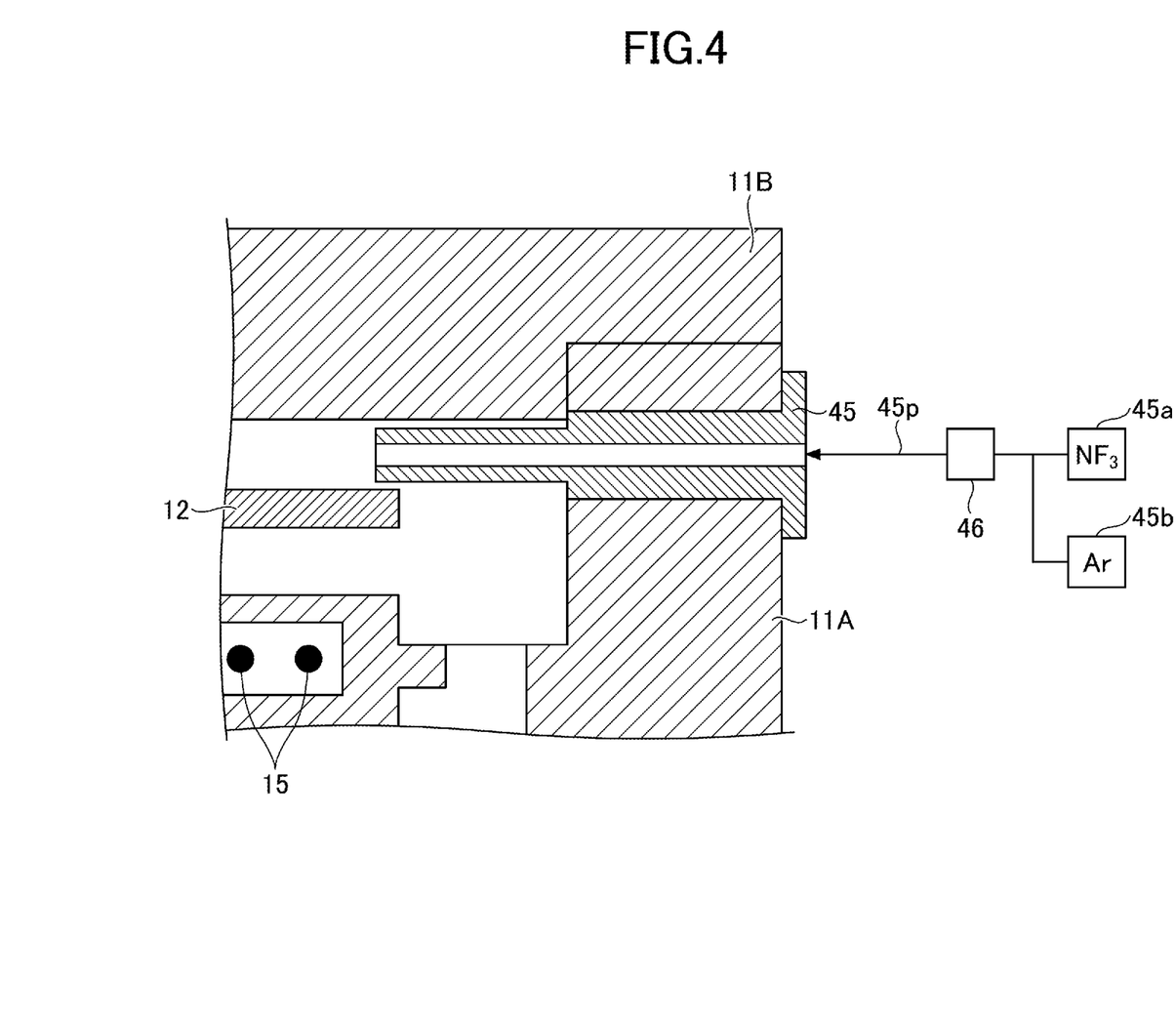
FIG. 4 is another cross-sectional view of the film deposition apparatus of FIG. 1.

A gas discharge port 21, an exhaust port 22, and a purge gas discharge port 23 are opened on the lower surface of the gas supply and exhaust unit 2. More gas discharge ports 21 are arranged in a fan-shaped area 24 that is located inside the periphery of the lower surface of the gas supply and exhaust unit 2. During the film deposition process, the gas discharge ports 21 discharge the Si-containing gas downward in a shower during the rotation of the rotary table 12 to supply the Si-containing gas to the entire surface of the wafer W. The silicon-containing gas is, for example, dichlorosilane (DCS) gas.

In the fan-shaped area 24, three areas 24A, 24B and 24C are set from the center side to the periphery side of the rotary table 12. In the gas supply and exhaust unit 2, gas flow paths (not illustrated) that are partitioned with each other are provided so that the Si-containing gas can be supplied independently to the gas discharge ports 21 provided in the respective areas 24A, 24B and 24C. Each of the gas flow paths partitioned with each other is connected, on the upstream side, to a source of the Si-containing gas (not illustrated) through a pipe with gas supply equipment including a valve and a mass flow controller.

The exhaust port 22 and the purge gas discharge port 23 are annularly opened at the periphery of the lower surface of the gas supply and exhaust unit 2 so as to surround the fan-shaped area 24 and face the upper surface of the rotary table 12. The purge gas discharge port 23 is located outside the exhaust port 22. The area inside the exhaust port 22 on the rotary table 12 forms a first processing region R1 where the Si-containing gas is adsorbed on the surface of the wafer W. An exhaust device (not illustrated) is connected to the exhaust port 22, and a purge gas source is connected to the purge gas discharge port 23. The purge gas is, for example, an argon (Ar) gas.

During the film deposition process, the Si-containing gas is discharged from the gas discharge ports 21, is exhausted from the exhaust port 22, and the purge gas is discharged from the purge gas discharge port 23. This causes the Si-containing gas and the purge gas discharged toward the rotary table 12 to move toward the exhaust port 22 along the upper surface of the rotary table 12 and to be discharged from the exhaust port 22. By the purge gas being discharged and exhausted in such a way, the atmosphere in the first processing region R1 is separated from the external atmosphere, and the Si-containing gas can be supplied to the first processing region R1 in a restrictive manner. That is, the mixing of the Si-containing gas supplied to the first processing region R1 with each gas and the active species of the gas, supplied to the outside of the first processing region R1 by plasma forming units 3A to 3C, which will be described later, can be suppressed.

In second to fourth processing regions R2 to R4, the plasma forming units 3A to 3C are provided to activate (excite) the gas supplied to each region. The plasma forming units 3A to 3C are each similarly formed. In the following, the plasma forming unit 3C illustrated in FIG. 1 will be described as a representative.

The plasma forming unit 3C supplies a plasma forming gas on the rotary table 12 and supplies microwaves to the plasma forming gas to generate plasma on the rotary table 12. The plasma forming unit 3C includes an antenna 31 for supplying microwaves.

The antenna 31 includes a dielectric plate 32 and a metal waveguide 33. In plan view, the dielectric plate 32 is formed in a substantially fan shape that extends along the peripheral edge of the rotary table 12 in the circumferential direction and from the center side to the peripheral edge side of the rotary table 12 in the radial direction. On the top plate 11B, a through-hole having a substantially fan-shape is provided to correspond to the shape of the dielectric plate 32, and the inner peripheral surface of the lower end of the through-hole slightly projects toward the center of the through-hole to form a support 34. The dielectric plate 32 is provided to cover the through-hole from the upper side and face the rotary table 12, and the peripheral edge of the dielectric plate 32 is supported by the support 34. The waveguide 33 is provided on the dielectric plate 32. The waveguide 33 has an internal space 35 extending to the top plate 11B. On the upper surface of the dielectric plate 32, a slot plate 36 is provided so as to be in contact with the dielectric plate 32. The slot plate 36 forms the lower part of the waveguide 33. The slot plate 36 has multiple slot holes 36A. The end of the waveguide 33 on the center side of the rotary table 12 is closed, and the end of the waveguide 33 on the peripheral edge side of the rotary table 12 is connected to a microwave generator 37. The microwave generator 37 supplies microwaves of 2.45 GHz to the waveguide 33, for example.

A gas injector 41 is provided at the downstream end of the second processing region R2. The gas injector 41 is connected to a hydrogen ($H_2$) gas supply source 41a and an argon (Ar) gas supply source 41b through a pipe 41p. The gas injector 41 discharges the $H_2$ gas and the Ar gas toward the upstream side. The gas injector 41 may be connected to further another gas source.

A gas injector 42 is provided at the upstream end of the third processing region R3. The gas injector 42 is connected to an $H_2$ gas supply source 42a and an Ar gas supply source 42b through a pipe 42p. The gas injector 42 discharges the $H_2$ gas and the Ar gas toward the downstream side. The gas injector 42 may be connected to further another gas source.

A gas injector 43 is provided at the downstream end of the fourth processing region R4. The gas injector 43 is connected to a $H_2$ gas supply source 43a, an ammonia ($NH_3$) gas supply source 43b, and an Ar gas supply source 43c through a pipe 43p. The gas injector 43 discharges the $H_2$ gas, an $NH_3$ gas, and the Ar gas toward the upstream side. The gas injector 43 may be connected to further another gas source.

The gas injectors 41 to 43 are each formed of a long and thin tubular body with its front end being closed, as illustrated in FIGS. 1 and 2, for example. The gas injectors 41 to 43 are provided on the side wall of the vacuum chamber 11 so as to extend horizontally from the side wall of the vacuum chamber 11 toward the central region, and are respectively arranged so as to intersect regions through which the wafers W mounted on the rotary table 12 pass. In the gas injectors 41 to 43, gas discharge ports 40 are respectively formed along the longitudinal direction. For example, the gas discharge ports 40 are formed in the gas injectors 41 to 43 to cover areas where the wafers W mounted on the rotary table 12 pass.

In the second to fourth processing regions R2 to R4, the microwaves supplied to the waveguide 33 pass through the slot hole 36A of the slot plate 36 to reach the dielectric plate 32, and are supplied to the gases discharged below the dielectric plate 32, such as the $H_2$ gas, the $NH_3$ gas, and the Ar gas. This restrictively forms plasma in the second to fourth processing regions R2 to R4 below the dielectric plate 32.

A gas injector 45 is provided between the second processing region R2 and the third processing region R3, as illustrated in FIG. 2. The gas injector 45 is formed of a thin and long tubular body with its front end being opened. The gas injector 45 is provided to pass through the side wall of the vacuum chamber 11 so as to extend horizontally from the side wall of the body 11A toward the central region. The gas injector 45 discharges a nitrogen trifluoride ($NF_3$) gas and the Ar gas from the opening on the front end side toward the center of the vacuum chamber 11.

The gas injector 45 is connected to an $NF_3$ gas supply source 45a and an Ar gas supply source 45b through a pipe 45p. A remote plasma source 46 is provided at the pipe 45p. The remote plasma source 46 activates the $NF_3$ gas and the Ar gas introduced from respective sources to the gas injector 45 through the pipe 45p by plasma. This causes the gas injector 45 to discharge the activated $NF_3$ gas and Ar gas into the vacuum chamber 11. The $NF_3$ gas is an example of a cleaning gas and the Ar gas is an example of a carrier gas.

The front end of the gas injector 45 is preferably located inward (i.e., towards the center of the rotary table 12) relative to the periphery of the rotary table 12 in plan view. This can prevent the $NF_3$ gas and the Ar gas from traveling around to the lower surface side of the rotary table 12 and can efficiently supply the $NF_3$ gas and the Ar gas to the upper surface side of the rotary table 12. The front end of the gas injector 45 is preferably located outward (i.e. towards the sidewall of the body 11A) relative to the outer periphery of the rotational trajectory of the recess 14 in plan view. This allows the $NF_3$ gas and the Ar gas to be supplied in a wide area from the center side to the periphery side of the rotary table 12.

A separation region D is provided between the third processing region R3 and the fourth processing region R4, as illustrated in FIG. 2. A ceiling surface of the separation region D is set lower than the ceiling surface of each of the third processing region R3 and the fourth processing region R4. In plan view, the separation region D is formed in a fan shape that extends along the peripheral edge of the rotary table 12 in the circumferential direction and from the center side to the peripheral edge side of the rotary table 12 in the radial direction, and the lower surface of the separation region D is close to and opposite to the upper surface of the rotary table 12. The distance between the lower surface of the separation region D and the upper surface of the rotary table 12 is set to, for example, 3 mm to suppress the amount of the gas entering below the separation region D. Here, the lower surface of the separation region D may be set to the same height as the lower surface of the top plate 11B.

A first exhaust port 51, a second exhaust port 52, and a third exhaust port 53 are respectively opened outside the rotary table 12 at positions respectively facing the upstream end of the second processing region R2, the downstream end of the third processing region R3, and the upstream end of the fourth processing region R4. The first to third exhaust ports 51 to 53 respectively exhaust gases in the second to fourth processing regions R2 to R4.

As illustrated in FIG. 1, the third exhaust port 53 is formed to be opened upward in an area outside the rotary table 12 in the body 11A. The opening of the third exhaust port 53 is located below the rotary table 12. The third exhaust port 53 is connected to an exhaust device 54 through an exhaust flow path 531. Additionally, the first exhaust port 51 and the second exhaust port 52 are also formed in substantially the same manner as the third exhaust port 53, and are connected to a common exhaust device 54 through exhaust flow paths 511 and 521, for example. Each of the exhaust flow paths 511, 521, and 531 is provided with an exhaust volume adjuster (not illustrated), and is configured such that the exhaust volumes from the first to third exhaust ports 51 to 53 by the exhaust device 54 can be individually adjusted, for example. Here, the exhaust volumes from the first to third exhaust ports 51 to 53 may be adjusted by a common exhaust volume adjuster. As described, in the second to fourth processing regions R2 to R4, gasses discharged from the gas injectors 41 to 43 are respectively discharged from the first to third exhaust ports 51 to 53, and a vacuum atmosphere with a pressure corresponding to these exhaust volumes is formed in the vacuum chamber 11.

As illustrated in FIG. 1, the controller 10 is provided in the film deposition apparatus 1. The controller 10 is, for example, a computer. A program is stored in the controller 10. With respect to the program, a group of steps is arranged so that control signals are sent to respective sections of the film deposition apparatus 1 to control the operations of the respective sections and a cleaning method described later is executed. Specifically, the rotational speed of the rotary table 12 by the rotation mechanism 13, the flow rate and supply or stop of each gas by a corresponding gas supply device, the exhaust volume by the exhaust device 54, the supply or stop of microwaves from the microwave generator 37 to the antenna 31, the power supply to the heater 15, and the like, are controlled by the program. The control of the power supply to the heater 15 is the control of the temperature of the wafer W, and the control of the exhaust volume by the exhaust device 54 is the control of the pressure in the vacuum chamber 11. The program is installed in the controller 10 from a storage medium such as a hard disk drive, a compact disk, a magneto-optical disk, or a memory card.

[Cleaning Method]

Figure 5:
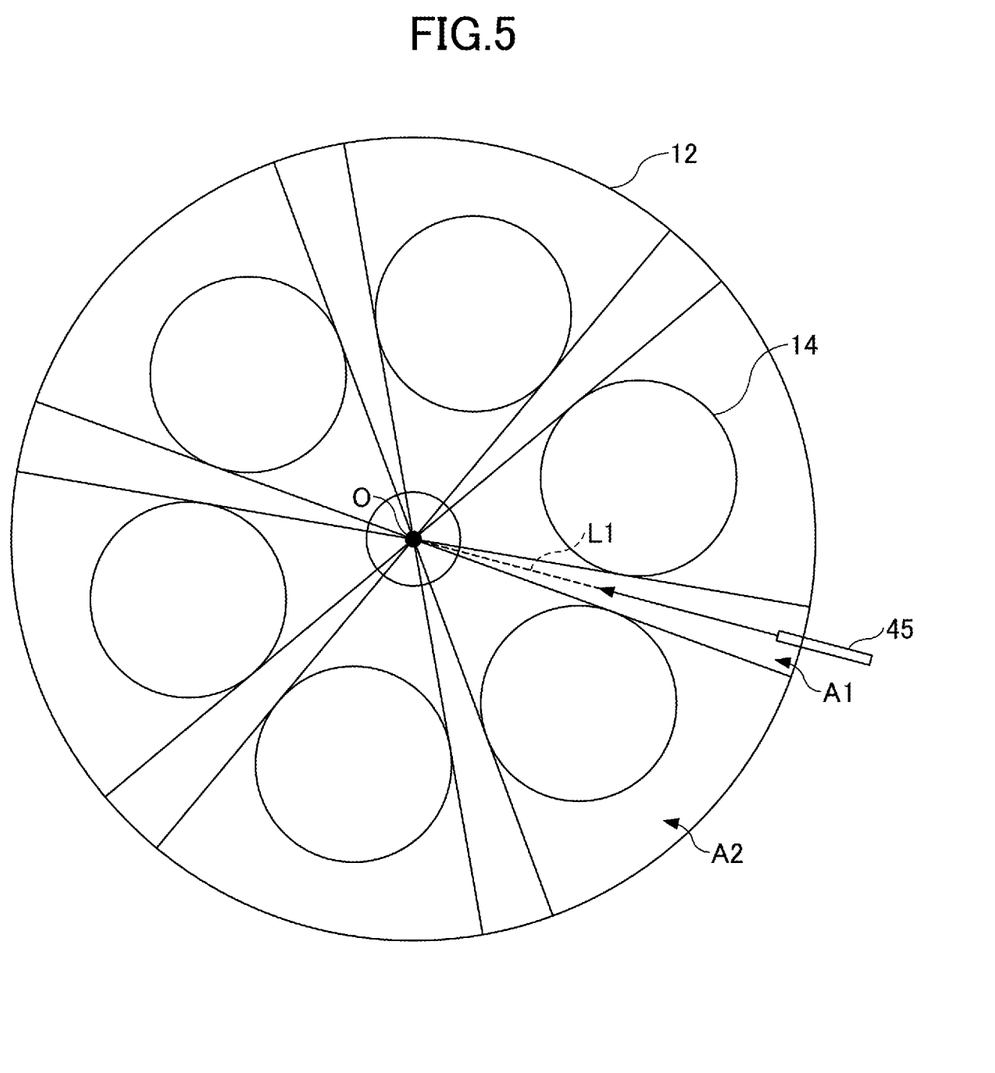
FIG. 5 is a drawing (1) illustrating a cleaning method according to the embodiment.
Figure 6:
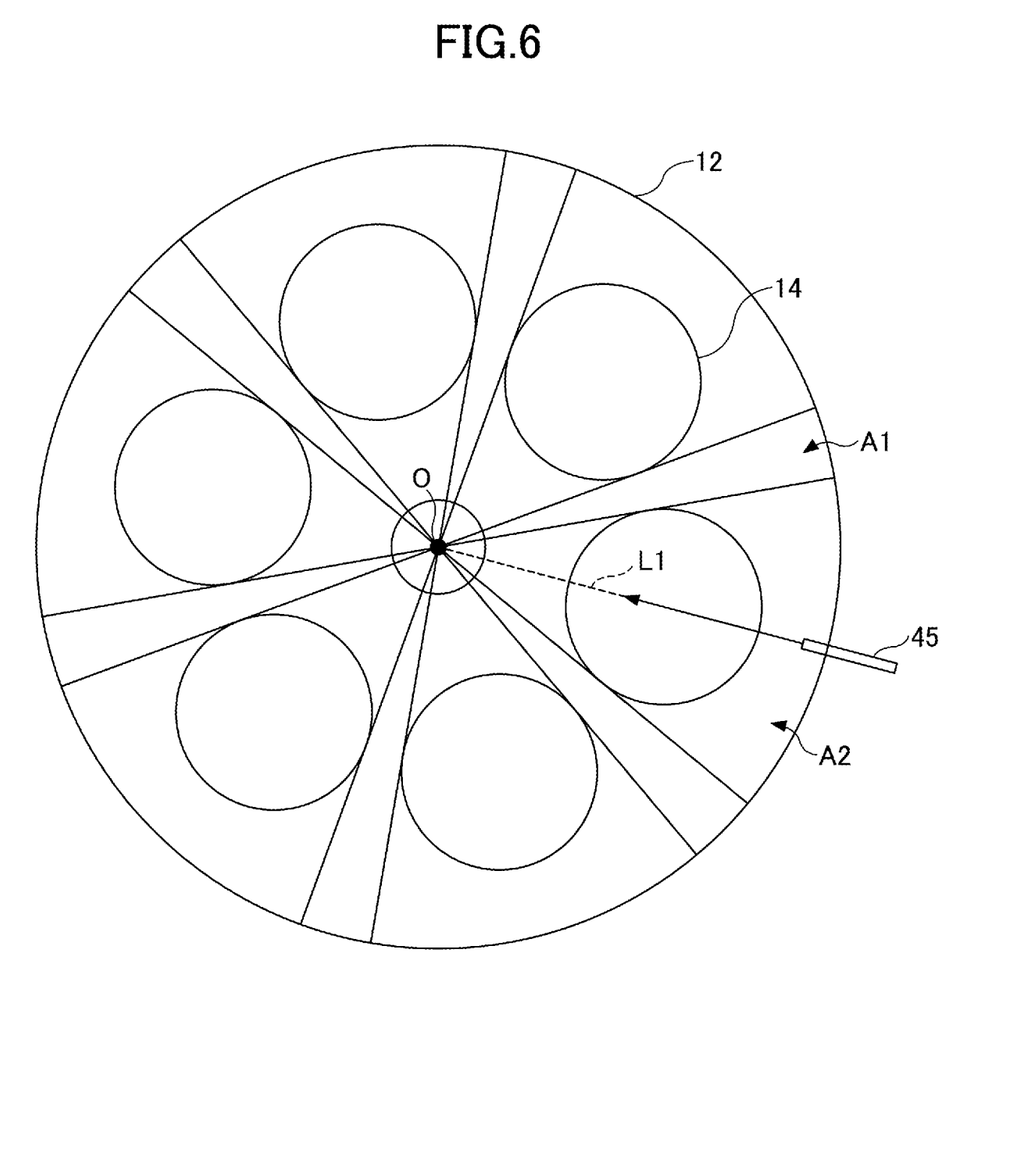
FIG. 6 is a drawing (2) illustrating the cleaning method according to the embodiment.

A cleaning method according to the embodiment will be described with reference to FIGS. 5 to 7. The cleaning method according to the embodiment is performed when the film, deposited on the rotary table 12 by the film deposition process being repeated, is removed. The film is, for example, an SiN film. The cleaning method according to the embodiment is performed in a state in which the wafer W is not mounted in the recess 14.

First, the inside of the vacuum chamber 11 is decompressed to a predetermined pressure, and the rotary table 12 is rotated at a predetermined rotational speed V1. The predetermined rotational speed V1 may be, for example, 10 rpm or less. Additionally, the $NF_3$ gas and the Ar gas are discharged from the gas injector 45 into the vacuum chamber 11. The $NF_3$ gas and the Ar gas are activated by the remote plasma source 46 and discharged. The $NF_3$ gas discharged into the vacuum chamber 11 removes the film deposited on the rotary table 12 by etching. The output P1 of the remote plasma source 46 may be from 2000 W to 4000 W, and, for example, 3000 W.

At this time, the controller 10 identifies the position of each recess 14 on the rotary table 12 based on the rotation angle of the rotary table 12 transmitted from the rotation mechanism 13. Additionally, the controller 10 adjusts the flow rate of the Ar gas discharged from the gas injector 45 into the vacuum chamber 11 based on the identified position of each recess 14.

Specifically, when the recess 14 is not located on a line segment connecting the gas injector 45 and the center O of the rotary table 12 in plan view (hereafter referred to as a "first line segment L1") with the rotary table 12 being rotated (see FIG. 5), the controller 10 adjusts the flow rate of the Ar gas to a first flow rate F1 (step S1). The first flow rate F1 is preferably the flow rate at which the $NF_3$ gas and the Ar gas reach the center side of the rotary table 12. The first flow rate F1 may be 500 sccm to 1000 sccm, and, for example, 770 sccm. This allows the $NF_3$ gas to reach a wide area from the center side to the periphery side on the rotary table 12, so that the film deposited on the rotary table 12 can be approximately uniformly removed in the radial direction of the rotary table 12. In FIG. 5, the area where the recess 14 is not located on the first line segment L1 is illustrated as an area A1, and the area where the recess 14 is located on the first line segment L1 is illustrated as an area A2. The same applies to FIG. 6 and FIG. 7.

Subsequently, when the recess 14 begins to be located on the first line segment L1 in plan view with the rotary table 12 being rotated (see FIG. 6), the controller 10 changes the flow rate of the Ar gas from the first flow rate F1 to a second flow rate F2 (step S2). The second flow rate F2 is smaller than the first flow rate F1 and is preferably a flow rate at which more $NF_3$ gas and Ar gas are supplied to the peripheral edge side than to the center side on the rotary table 12. The second flow rate F2 may be 100 sccm to 300 sccm, and, for example, 170 sccm. This causes the $NF_3$ gas not to easily reach the center side on the rotary table 12, so that the etching rate of the film deposited on the center side on the rotary table 12 is reduced. Additionally, the controller 10 adjusts the flow rate of the $NF_3$ gas to the flow rate F3 in steps S1 and S2. The flow rate F3 of the $NF_3$ gas may be from 100 sccm to 500 sccm, and, for example, 250 sccm.

Here, when the film formation process is repeated, the SiN film is deposited on the rotary table 12. Because the film deposition is performed in a state in which the wafer W is mounted on each recess 14, the film thickness of the SiN film deposited on each recess 14 is less than the film thickness of the SiN film deposited on an area other than each recess 14 on the rotary table 12. Therefore, when the same amount of the $NF_3$ gas is supplied to all the areas on the rotary table 12, the film deposited on the recess 14 is removed earlier than the film deposited on the area other than the recess 14, and the surface of the recess 14 is exposed. If the exposed surface of the recess 14 is exposed to the $NF_3$ gas, the surface of the recess 14 may be etched and the shape of the recess 14 may be changed.

Thus, in the embodiment, in step S2, when the recess 14 begins to be located on the first line segment L1 in plan view (see FIG. 6), the controller 10 reduces the flow rate of the Ar gas discharged from the gas injector 45 into the vacuum chamber 11 from the first flow rate F1 to the second flow rate F2. This causes the etching rate of the film deposited on the recess 14 to be smaller than the etching rate of the film deposited on the peripheral edge side of the rotary table 12. Therefore, the surface of the recess 14 can be prevented from being exposed before the film deposited on the area other than the recess 14 on the rotary table 12 is removed. As a result, the change in the shape of the recess 14 can be avoided.

Subsequently, when the recess 14 is no longer located on the first line segment L1 in plan view with the rotary table 12 being rotated, the controller 10 changes the flow rate of the Ar gas discharged from the gas injector 45 into the vacuum chamber 11 from the second flow rate F2 to the first flow rate F1 (step S1).

Figure 7:
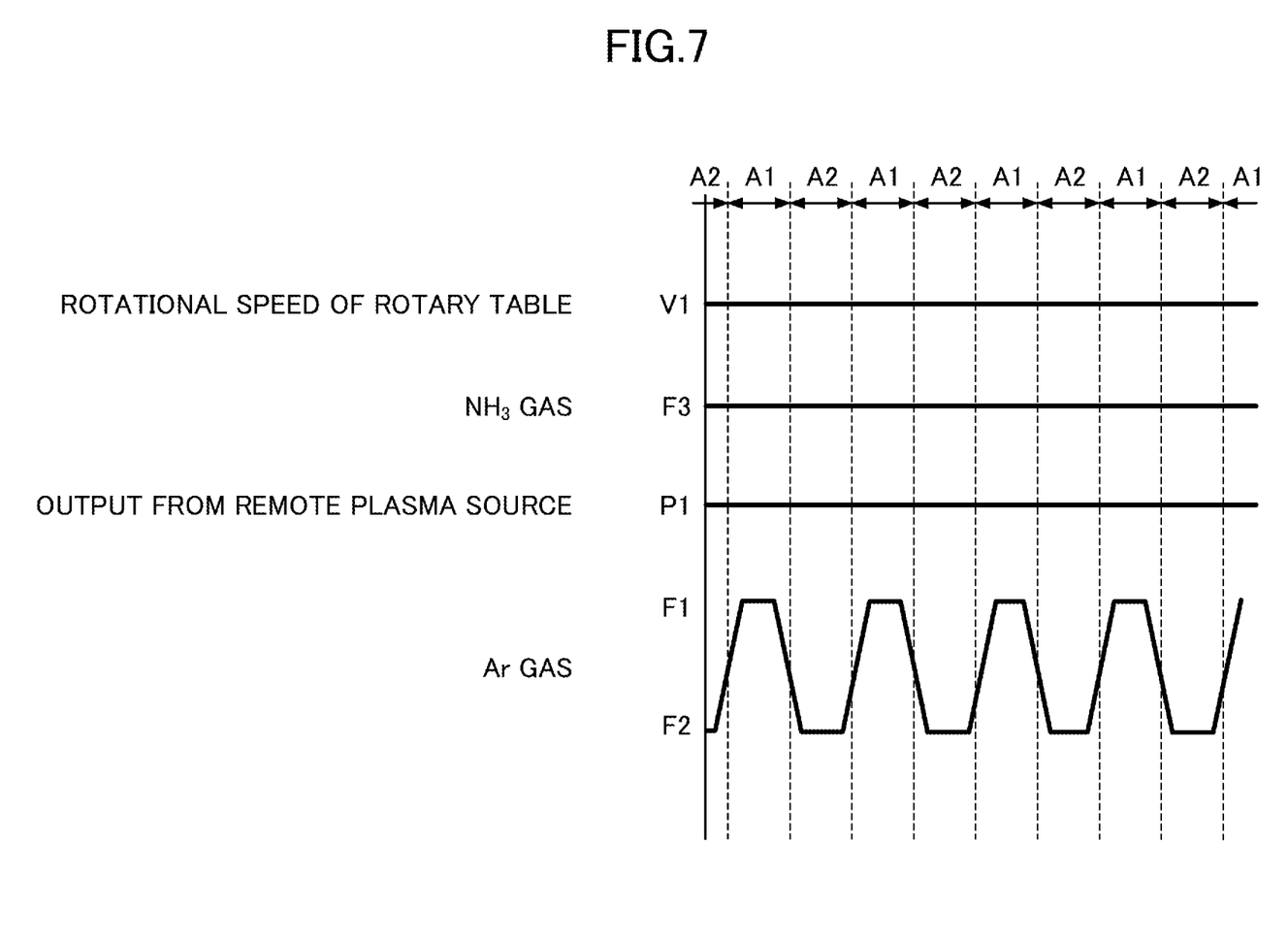
FIG. 7 is a drawing (3) illustrating the cleaning method according to the embodiment.

As described, with rotating the rotary table 12, the controller 10 switches the flow rate of the Ar gas discharged from the gas injector 45 into the vacuum chamber 11 between the first flow rate F1 and the second flow rate F2, based on whether the recess 14 is located on the first line segment L1 in plan view (see FIG. 7). Because six recesses 14 are formed on the rotary table 12 in the film deposition apparatus 1 of the embodiment, the controller 10 switches from step S1 to step S2 and from step S2 to step S1 six times, which is equal to the number of the recesses 14, while the rotary table 12 rotates by one revolution.

Here, in steps S1 and S2, the Ar gas may be discharged from the purge gas discharge port 23 and the gas injectors 41 to 43. This prevents the $NF_3$ gas discharged from the gas injector 45 from entering the gas discharge port 21 and the gas injectors 41 to 43 when cleaning the inside of the vacuum chamber 11.

Additionally, the controller 10 may control the rotation mechanism 13 so that the rotational speed of the rotary table 12 in step S2 is greater than the rotational speed of the rotary table 12 in step S1. This shortens the time during which the recess 14 is exposed to the $NF_3$ gas, so that the surface of the recess 14 can be prevented from being exposed.

Additionally, the controller 10 may reduce the flow rate of the $NF_3$ gas in step S2 more than the flow rate of the $NF_3$ gas in step S1. This reduces the amount of the $NF_3$ gas supplied onto the recess 14, so that the surface of the recess 14 can be prevented from being exposed.

Additionally, the controller 10 may adjust the flow rate of the Ar gas discharged from the gas injector 45 into the vacuum chamber 11 to the first flow rate F1 when the length occupied by the recess 14 on the first line segment L1 in plan view is shorter than the length occupied by a portion other than the recess 14. Additionally, the controller 10 may adjust the flow rate of the Ar gas discharged from the gas injector 45 into the vacuum chamber 11 to the second flow rate F2 when the length occupied by the recess 14 on the first line segment L1 in plan view is longer than the length occupied by the portion other than the recess 14.

EXAMPLE

An example in which the relationship between the flow rate of the Ar gas and the etching rate distribution was evaluated is described with reference to FIG. 8. In the example, the etching rate of the SiN film in the radial direction of the rotary table 12 was measured in the film deposition apparatus 1 when the flow rate of the $NF_3$ gas discharged from the gas injector 45 into the vacuum chamber 11 was fixed at 250 sccm and the flow rate of the Ar gas was changed. The flow rate of the Ar gas is changed in five conditions: 170 sccm, 270 sccm, 370 sccm, 570 sccm, and 770 sccm.

Figure 8:
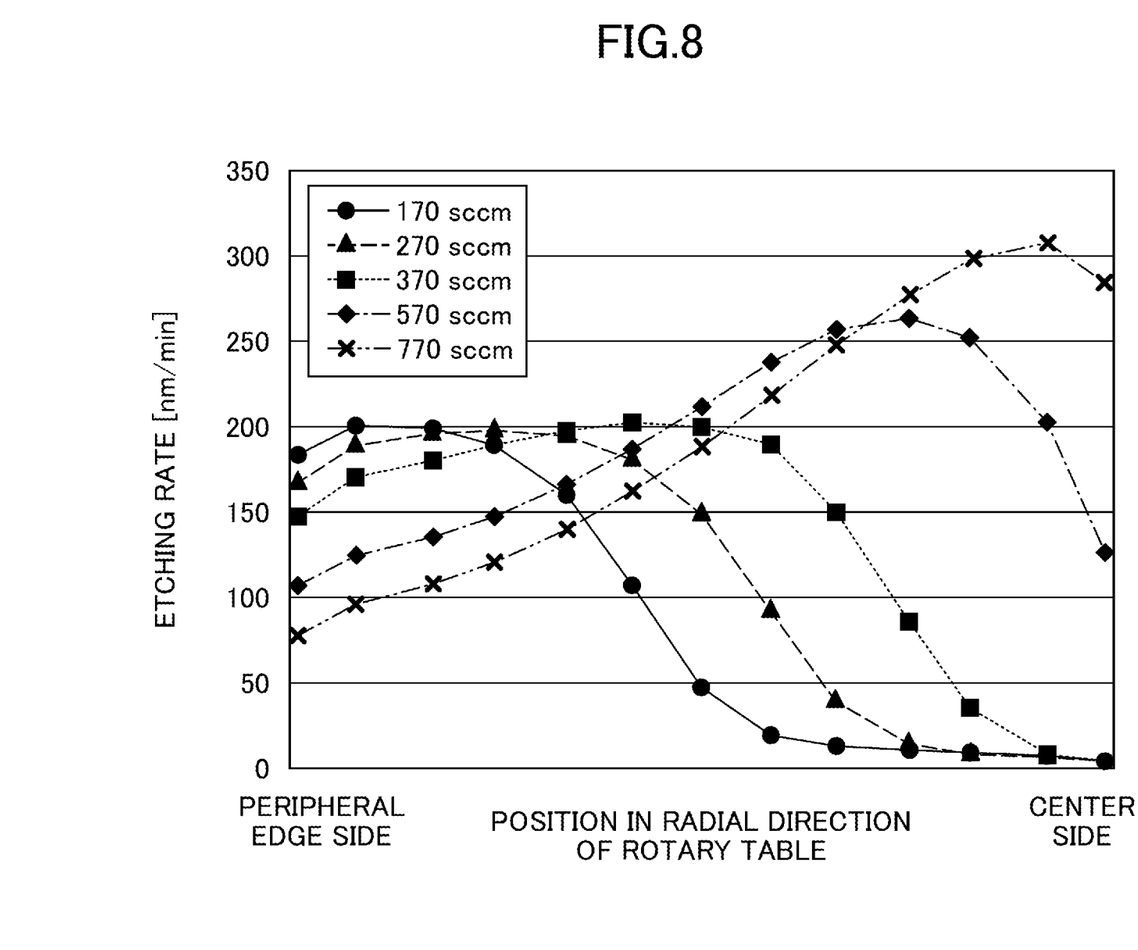
FIG. 8 is a graph indicating the relationship between the flow rate of an Ar gas and the etching rate distribution.

FIG. 8 is a graph indicating the relationship between the flow rate of the Ar gas and the etching rate distribution. In FIG. 8, the horizontal axis indicates the position in the radial direction of the rotary table 12, and the vertical axis indicates the etching rate [nm/min] of the SiN film.

As illustrated in FIG. 8, it is found that when the flow rate of the Ar gas is increased, a high etching rate is obtained in a wide range from the periphery side to the center side of the rotary table 12. It is conceivable that this is because when the flow rate of the Ar gas is increased, the flow rate of the $NF_3$ gas discharged with the Ar gas is increased, and a large amount of $NF_3$ plasma or $NF_3$ radical reaches the center side of the rotary table 12.

Conversely, it is found that when the flow rate of the Ar gas is reduced, a high etching rate is obtained on the peripheral edge side of the rotary table 12, but the etching rate is low on the central side of the rotary table 12, and the SiN film is not appreciably etched. It is conceivable that this is because when the flow rate of the Ar gas is reduced, the flow rate of the $NF_3$ gas discharged with the Ar gas is reduced, and most of the discharged $NF_3$ gas is consumed on the peripheral edge side of the rotary table 12 and does not reach the center side of the rotary table 12.

The disclosed embodiment should be considered to be illustrative in all respects and not restrictive. The above embodiment may be omitted, replaced, or altered in various forms without departing from the scope and the subject matter of the claims.

In the above embodiment, the case where the film deposition apparatus includes three plasma forming units has been described, but the present disclosure is not limited to this. For example, the film deposition apparatus may include one, two, or four or more plasma formation units. Additionally, the film deposition apparatus need not include a plasma forming unit.

In the above embodiment, the case where the plasma forming unit is a unit that forms microwave plasma has been described, but the present disclosure is not limited to this. The plasma formation unit may include a unit that forms inductively coupled plasma, capacitively coupled plasma, or the like.

In the above embodiment, the case where the cleaning gas is the $NF_3$ gas has been described, but the present disclosure is not limited to this. For example, the cleaning gas may be chlorine trifluoride ($ClF_3$).

In the above embodiment, the case where the carrier gas is the Ar gas has been described, but the present disclosure is not limited to this. For example, the carrier gas may be an inert gas such as nitrogen ($N_2$) gas.

According to the present disclosure, the rotary table can be prevented from being etched during cleaning.

What is claimed is:

1. A cleaning method of cleaning an inside of a processing chamber in a film deposition apparatus, the film deposition apparatus including a rotary table rotatably provided in the processing chamber and a gas injector provided to pass through a side wall of the processing chamber, a plurality of mounting areas being provided on the rotary table in a circumferential direction, a wafer being mounted on each of the plurality of mounting areas, the gas injector having an opening at a front end of the gas injector, the front end of the gas injector is located toward the side wall of the processing chamber relative to an outer periphery of a rotational trajectory of the plurality of mounting areas in plan view, and the cleaning method comprising:
   (a) discharging a carrier gas and a cleaning gas from the opening of the gas injector toward a center of the processing chamber horizontally with rotating the rotary table, a flow rate of the carrier gas being adjusted to a first flow rate;
   (b) discharging the carrier gas and the cleaning gas from the opening of the gas injector toward the center of the processing chamber horizontally with rotating the rotary table, the flow rate of the carrier gas being adjusted to a second flow rate that is less than the first flow rate; and
   (c) performing switching from (a) to (b) and switching from (b) to (a) a predetermined number of times while the rotary table rotates by one revolution, the predetermined number being equal to a number of the plurality of mounting areas,
   wherein (a) is performed at least upon determining that the plurality of mounting areas are not located on a line section connecting the gas injector and a center of the rotary table in plan view,
   wherein (b) is performed at least upon determining that a center of a first mounting area among the plurality of mounting areas is located on the line section connecting the gas injector and the center of the rotary table in plan view,
   wherein the cleaning gas and the carrier gas reach the center of the rotary table at the first flow rate, and
   wherein an amount of the cleaning gas and the carrier gas supplied to a peripheral edge side area on the rotary table is greater than an amount of the cleaning gas and the carrier gas supplied to a center side area on the rotary table at the second flow rate.

2. The cleaning method as claimed in claim 1, wherein (c) includes performing the switching from (a) to (b) and the switching from (b) to (a) based on a rotation angle of the rotary table.

3. The cleaning method as claimed in claim 1, wherein a flow rate of the cleaning gas discharged in (b) is equal to a flow rate of the cleaning gas discharged in (a).

4. The cleaning method as claimed in claim 1, wherein a rotational speed of the rotary table in (b) is greater than a rotational speed of the rotary table in (a).

5. The cleaning method as claimed in claim 1, wherein the cleaning gas is a nitrogen trifluoride gas, and is activated by remote plasma and discharged.

6. The cleaning method as claimed in claim 1, wherein the plurality of mounting areas are recesses recessed with respect to an upper surface of the rotary table.

7. A film deposition apparatus comprising:
   a controller,
   wherein the controller is configured to perform a cleaning method of cleaning an inside of a processing chamber in the film deposition apparatus, the film deposition apparatus including a rotary table rotatably provided in the processing chamber and a gas injector provided to pass through a side wall of the processing chamber, a plurality of mounting areas being provided on the rotary table in a circumferential direction, a wafer being mounted on each of the plurality of mounting areas, the gas injector having an opening at a front end of the gas injector, the front end of the gas injector is located toward the side wall of the processing chamber relative to an outer periphery of a rotational trajectory of the plurality of mounting areas in plan view, and the cleaning method comprising (a) discharging a carrier gas and a cleaning gas from the opening of the gas injector toward a center of the processing chamber horizontally with rotating the rotary table, a flow rate of the carrier gas being adjusted to a first flow rate; (b)

discharging the carrier gas and the cleaning gas from the opening of the gas injector toward the center of the processing chamber horizontally with rotating the rotary table, the flow rate of the carrier gas being adjusted to a second flow rate that is less than the first flow rate; and (c) performing switching from (a) to (b) and switching from (b) to (a) a predetermined number of times while the rotary table rotates by one revolution, the predetermined number being equal to a number of the plurality of mounting areas, wherein (a) is performed at least upon determining that the plurality of mounting areas are not located on a line section connecting the gas injector and a center of the rotary table in plan view, wherein (b) is performed at least upon determining that a center of a first mounting area among the plurality of mounting areas is located on the line section connecting the gas injector and the center of the rotary table in plan view, wherein the cleaning gas and the carrier gas reach the center of the rotary table at the first flow rate, and wherein an amount of the cleaning gas and the carrier gas supplied to a peripheral edge side area on the rotary table is greater than an amount of the cleaning gas and the carrier gas supplied to a center side area on the rotary table at the second flow rate.

* * * * *